United States Patent [19]

Shiba et al.

[11] Patent Number: 4,918,349
[45] Date of Patent: Apr. 17, 1990

[54] SURFACE ACOUSTIC WAVE DEVICE HAVING APODIZED TRANSDUCER PROVIDED WITH IRREGULAR PITCH ELECTRODE GROUP

[75] Inventors: Takashi Shiba; Yuji Fujita, both of Yokohama; Toshimitsu Takahashi, Sagamihara; Jun Yamada, Yokohama, all of Japan

[73] Assignee: Hitachi, Ltd., Tokyo, Japan

[21] Appl. No.: 267,294

[22] Filed: Nov. 4, 1988

[30] Foreign Application Priority Data

Nov. 13, 1987 [JP] Japan ................................ 62-285338
Dec. 23, 1987 [JP] Japan ................................ 62-323960

[51] Int. Cl.$^4$ ........................................... H01L 41/08
[52] U.S. Cl. ............................ 310/313 C; 310/313 B; 333/154
[58] Field of Search ........... 310/313 B, 313 C, 313 D; 333/193, 194, 150, 151, 154

[56] References Cited

U.S. PATENT DOCUMENTS

| 4,160,219 | 7/1979 | Kuny | 310/313 C X |
| 4,160,963 | 7/1979 | Hays, Jr. | 310/313 C X |
| 4,477,784 | 10/1984 | Maerfeld et al. | 310/313 D X |

FOREIGN PATENT DOCUMENTS

| 0066118 | 5/1980 | Japan | 310/313 C |
| 1360235 | 7/1974 | United Kingdom | 310/313 C |

Primary Examiner—Mark O. Budd
Attorney, Agent, or Firm—Antonelli, Terry & Wands

[57] ABSTRACT

A surface acoustic wave device characterized in that in addition to linear first bus-bar electrodes which connect in alignment the edges of the same potential electrodes of interdigital electrodes, second bus-bar electrodes are provided which connect the same potential electrodes in the vicinity of the overlapping positions. Also disclosed is a surface acoustic wave device characterized in that the metalized ratio g/p, which is the ratio of the width of an electrode and the intercentral distance between the adjacent electrodes in an irregular pitch electrode group, is varied between 0.1 to 0.4 or between 0.6 to 0.9.

8 Claims, 11 Drawing Sheets ic wave device according to the present invention;

SURFACE ACOUSTIC WAVE DEVICE HAVING APODIZED TRANSDUCER PROVIDED WITH IRREGULAR PITCH ELECTRODE GROUP

BACKGROUND OF THE INVENTION

With regard to conventional apodized interdigital transducers, methods are known of suppressing undesired reflection (hereinunder referred to as "MEL" (Mass Electrical Loading). Such MEL is caused by the difference in the characteristic impedance to the propagation of surface acoustic waves between a portion where there is an electrode and a portion where there in no electrode. One of the methods is described in "The IEEE Trans. MTT-22" (1974), pp 960 to 964 in which MEL is suppressed by making the width of an electrode equal to ⅛ of the wave length ($\lambda_0$) of a surface acoustic wave at the center frequency ($f_0$).

In the above-described prior art, however, no consideration is given to an irregular pitch electrode group in which the frequency characteristic of amplitude is non-symmetrical, in other words, the pitch of the sources of surface acoustic wave is not constant so that the suppression of the MEL is insufficient.

Although it is possible to suppress MEL by making the width of an electrode and a non-metalized part ⅛ of the intercentral distance between the adjacent sources of surface acoustic wave even when the frequency characteristic of amplitude is non-symmetrical and the intercentral distance between the adjacent electrodes is not constant, the above-described conventional method is insufficient for suppressing MEL when the asymmetry is too large or sufficient suppression of reflection is required.

SUMMARY OF THE INVENTION

Accordingly, it is an object of the present invention to eliminate the above-described problems in the prior art and to provide a surface acoustic wave device having small ripple frequency characteristics which will suppress MEL sufficiently.

To achieve this aim, in a first aspect of the present invention, there is provided a surface acoustic wave device characterized in that in addition to linear first bus-bar electrodes which connects in alignment the edges of the same potential electrodes of interdigital electrodes, second bus-bar electrodes are provided which connect the same potential electrodes in the vicinity of the overlapping positions (between the envelopes of apodizing overlapping function and the first bus-bar electrodes). In the different potential region between the second bus-bar electrodes, apodized electrodes are arranged at irregular pitches, and in the same potential regions between the first and the second bus-bar electrode regions, electrodes having a width of, for example, $\lambda_0/8$ are arranged at an interval of $\lambda_0/4$, wherein $\lambda_0$ is a wave length of a surface acoustic wave at the center frequency $f_0$.

It has been found that according to the structure of the surface acoustic wave device in the first aspect of the present invention, the reflection between the first and the second bus-bar electrodes is sufficiently suppressed, thereby lowering the level of reflection.

In a second aspect of the present invention, there is provided a surface acoustic wave device characterized in that the metalized ratio g/p, which is the ratio of the width of an electrode and the intercentral distance between the adjacent electrodes in an irregular pitch electrode group in which the pitch of the surface acoustic wave source is not constant, that is, it is not constantly 0.5, but is instead varied between 0.1 to 0.4 or between 0.6 to 0.9. This structure suppresses the reflection in a predetermined frequency band produced at the boundary of an electrode in which the characteristic impedance of the propagation material discontinuously changes.

The above and other objects, features and advantages of the present invention will become clear from the following description of the preferred embodiments thereof, taken in conjunction with the accompanying drawings.

DESCRIPTION OF THE PREFERRED EMBODIMENTS

Figure 1:
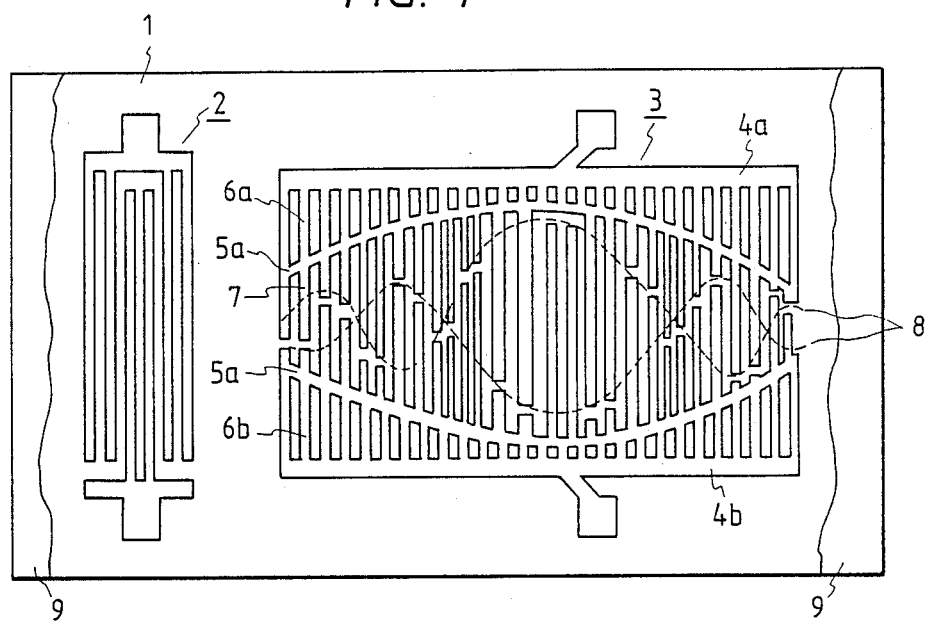
FIG. 1 is a schematic view of a first embodiment of a surface acoustic wave device according to the present invention.

FIG. 1 is a schematic view of a first embodiment of a surface acoustic wave device according to the present invention. On a surface acoustic wave substrate 1, an input interdigital transducer 2 and an output interdigital transducer 3 are arranged. The output interdigital transducer 3 is provided with first bus-bar electrodes 4a and 4b, and second bus-bar electrodes 5a and 5b. In the regions between the first and second bus-bar electrodes, electrodes 6a and 6b having a width of $\lambda_0/8$ are arranged at a regular interval of $\lambda_0/4$, wherein $\lambda_0$ is a wavelength of a surface acoustic wave at the center frequency $f_0$. The second bus-bar electrodes 5a and 5b are formed into a configuration of cosine. This is equivalent to a cosine window provided on the impulse response of reflection. In the region between the second bus-bar electrodes, electrodes 7 are arranged at irregular pitches.

These electrodes 7 arranged at irregular pitches produce non-symmetrical frequency characteristics.

In FIG. 1, the broken line 8 represents an envelope of overlapping function of the interdigital transducer. Both sides of the input and output interdigital transducers 2 and 3 are coated with an absorber 9 for preventing the surface acoustic waves from being reflected on the end surfaces of the substrate 1. The substrate 1 is composed of 128° Y-X LiNbO₂. 15 pairs of sources of surface acoustic wave are provided for the input interdigital transducer 2, and the aperture of the input transducer 2 is 3,000 μm. On the other hand, 50 pairs of sources of surface acoustic wave (the electrodes 7 between the second bus-bar electrodes 5a, 5b) are provided for the output interdigital transducer 3 and the max aperture of the output interdigital transducer 3 is 2,000 μm. The first embodiment is used for the intermediate frequency (IF) filter of a television receiver, and the center frequency is 56.5 MHz.

Figure 2:
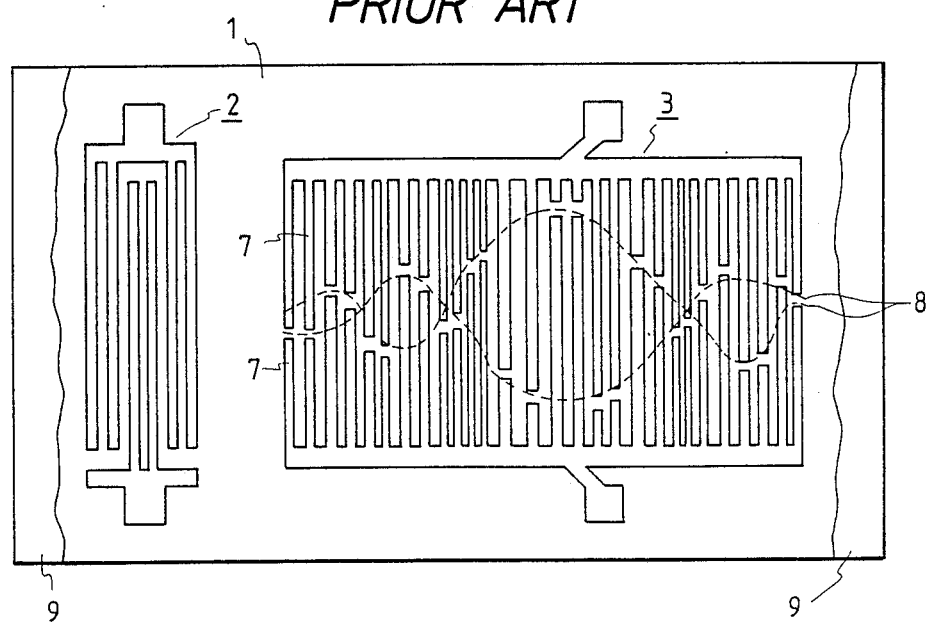
FIG. 2 is a schematic view of a conventional surface acoustic wave device.

FIG. 2 is a schematic view of a conventional surface acoustic wave device used for the same purpose as the first embodiment. The same numerals denote the same elements as those in FIG. 1. The substrate, the number of the sources of surface acoustic wave and the apertures of the transducers are the same as those in the first embodiment.

Figure 3:
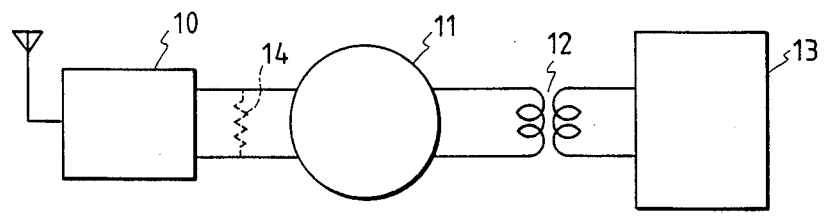
FIG. 3 is a block diagram of an intermediate frequency circuit of a television using a device according to the present invention.

FIG. 3 is a block diagram of an intermediate frequency circuit of television using a device according to the present invention. A surface acoustic wave device 11 according to the present invention is connected to a tuner 10 so as to extract a signal of one channel and set the pass band of the picture signal and the level of the sound signal. The output terminal is connected to an integrated circuit 13 having a function of preamplification, demodulation, etc. through a transformer 12. Conventionally, a dumping resistance 14 is connected to the device 11 in order to match the tuner 10 with the surface acoustic device 11 at the output portion. In the system using the device of the present invention, however, the impedance of the surface acoustic wave device is lowered and the resistance 14 is removed for the purpose of reducing loss. As a result, the input terminal side of the surface acoustic wave device assumes approximately matched state, and the reflected wave (RW) determined by the load of the transducer is about 10 dB. On the other hand, in the case of using a conventional surface acoustic wave device, the triple transit echo (TTE) among the electrodes is not sufficiently suppressed due to the above-described MEL.

Figure 4:
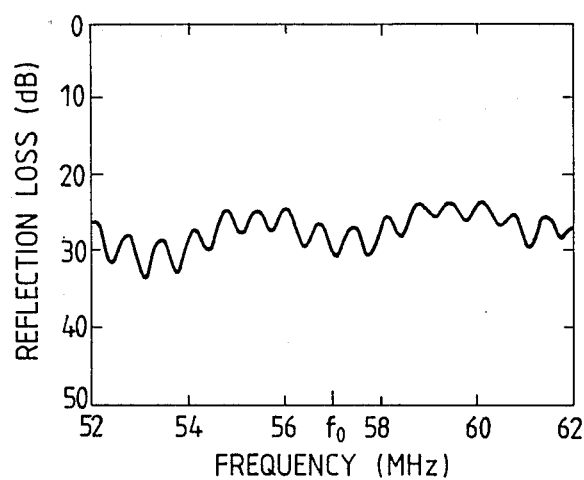
FIG. 4 shows the frequency characteristic of the reflection loss produced by an output interdigital transducer of the conventional device shown in FIG. 2.
Figure 5:
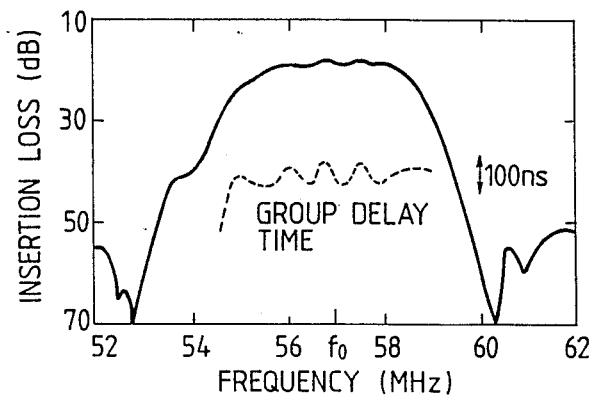
FIG. 5 shows the frequency characteristic of the insertion loss in the conventional device shown in FIG. 2.
Figure 6:
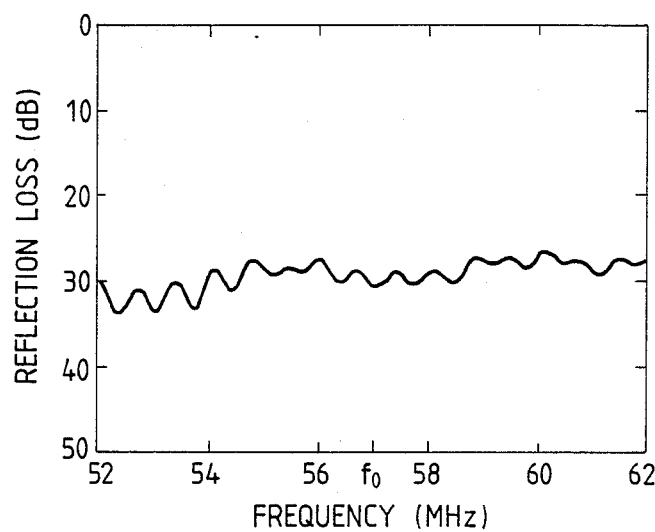
FIG. 6 shows the frequency characteristic of the reflection loss produced by an output interdigital transducer of the first embodiment shown in FIG. 1.
Figure 7:
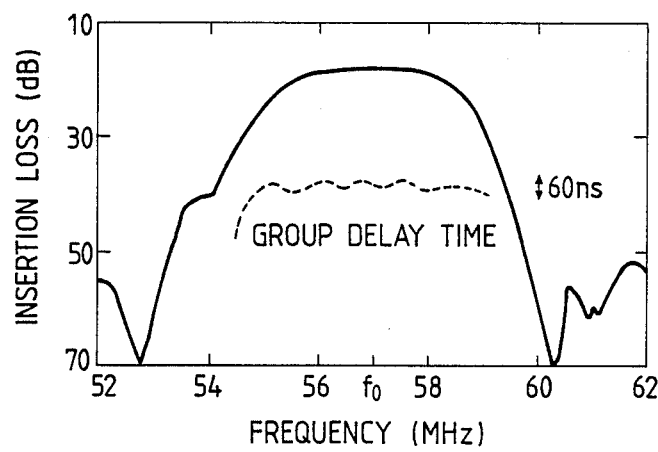
FIG. 7 shows the frequency characteristic of the insertion loss in the first embodiment shown in FIG. 1.

FIG. 4 shows the results of the measurement of the reflection (MEL) loss produced by the conventional output interdigital transducer shown in FIG. 2. The reflection (MEL) loss is about 23 dB in the filter band. Since the reflection loss on the input terminal side is 10 dB, the total reflection loss is 33 dB. FIG. 5 shows the insertion loss - frequency characteristic of the conventional device shown in FIG. 2. Although the loss is as good as 18 dB, an amplitude ripple of 0.5 dB$_{p-p}$ and a group delay ripple of 100 ns$_{p-p}$ are produced in the band. In contrast, FIG. 6 shows the results of the measurement of the reflection (MEL) loss produced by the output interdigital transducer of the first embodiment shown in FIG. 1. The reflection loss in the filter band is about 27 dB, and 37 dB in total. That is, the first embodiment has an effect of improving the reflection loss by 4 dB. FIG. 7 shows the insertion loss-frequency characteristic of the first embodiment. The amplitude ripple is 0.2 dB$_{p-p}$ and the group delay ripple is 60 ns$_{p-p}$. Thus, the insertion loss - frequency characteristic of the first embodiment is good.

Figure 8:
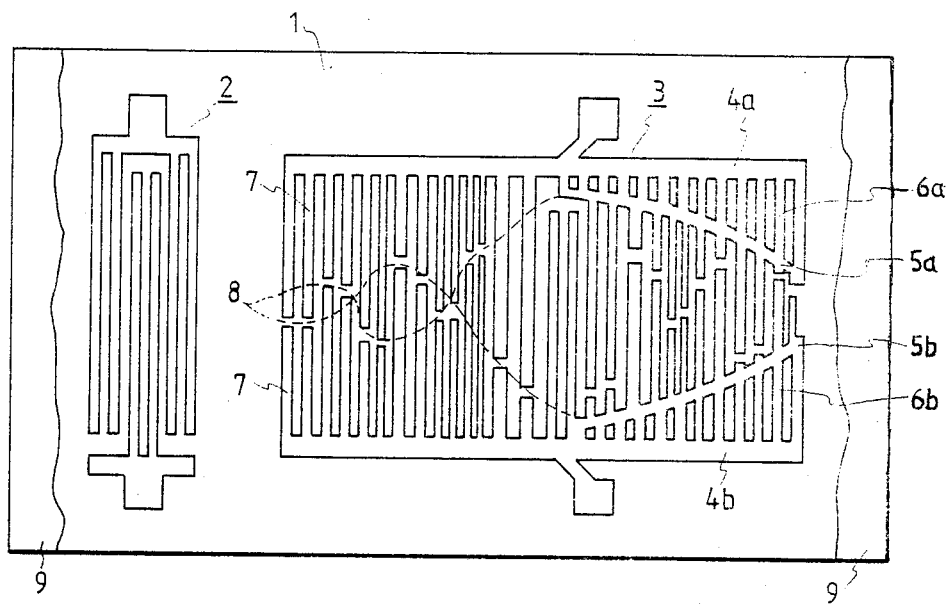
FIG. 8 is a schematic view of a second embodiment of a surface acoustic wave device according to the present invention.
Figure 9:
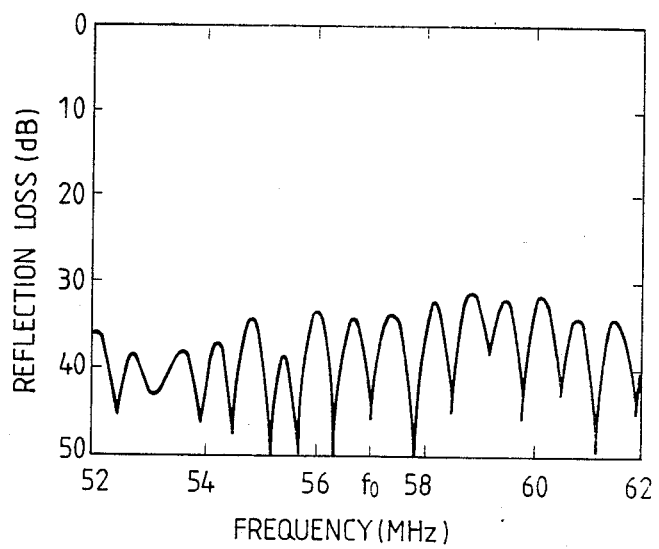
FIG. 9 shows the frequency characteristic of the reflection loss produced by the output interdigital transducer of the second embodiment shown in FIG. 8.

FIG. 8 is a schematic view of a second embodiment of a surface acoustic wave device according to the present invention. In this embodiment, the second bus-bar electrodes 5a and 5b are formed along the envelopes 8 on the output electrode 3 at portions apart from the input electrode 2. The other structure is the same as in the first embodiment, FIG. 9 shows the reflection loss-frequency characteristic of the second embodiment shown in FIG. 8. The reflection loss in the filter band is about 30 dB. That is, the second embodiment can suppress the reflection loss 3 dB more than the first embodiment.

Figure 10:
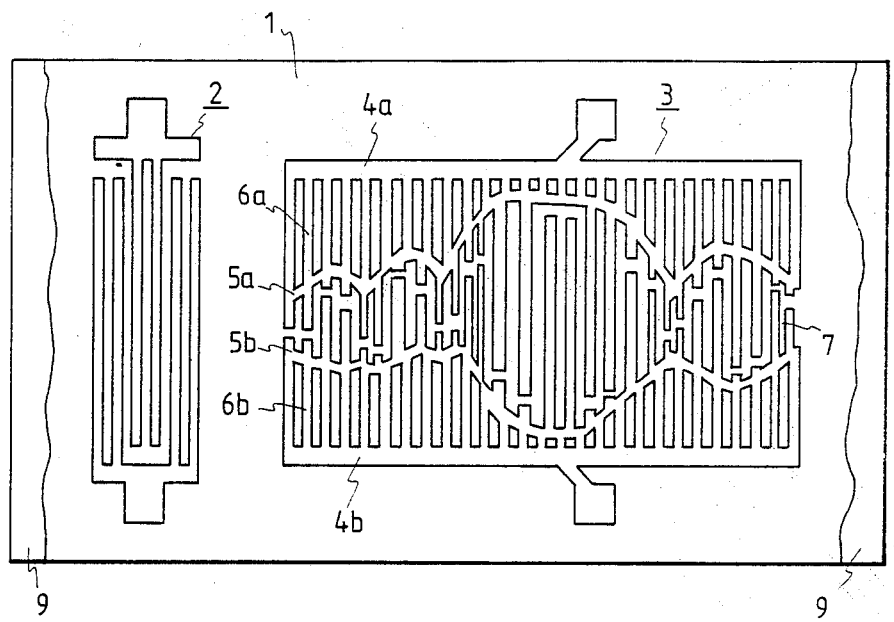
FIG. 10 is a schematic view of a third embodiment of a surface acoustic wave device according to the present invention.
Figure 11:
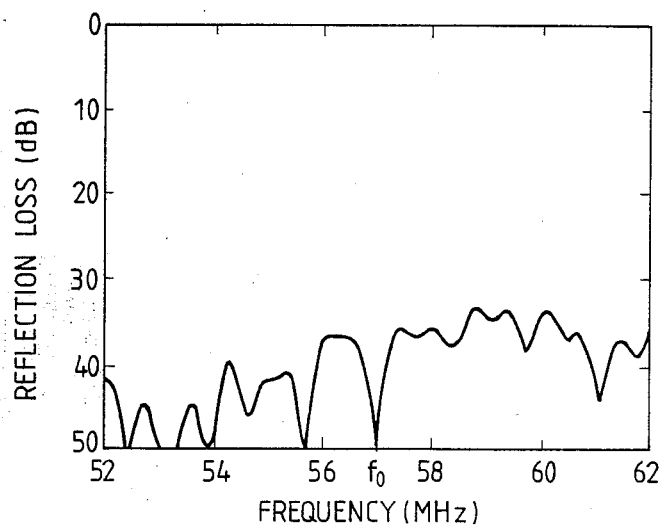
FIG. 11 shows the frequency characteristic of the reflection loss produced by the output interdigital transducer of the third embodiment shown in FIG. 10.

FIG. 10 is a schematic view of a third embodiment of a surface acoustic wave device according to the present invention. In this embodiment, the second bus-bar electrodes 5a and 5b are formed along the envelopes 8 on the entire part of the output electrode 3. The other structure is the same as in the first embodiment, FIG. 11 shows the reflection loss produced by the output interdigital transducer 3 in the third embodiment shown in FIG. 10. The reflection loss in the filter band is about 33 dB. That is, the second embodiment can suppress the reflection loss 3 dB more than the second embodiment shown in FIG. 8.

Figure 12:
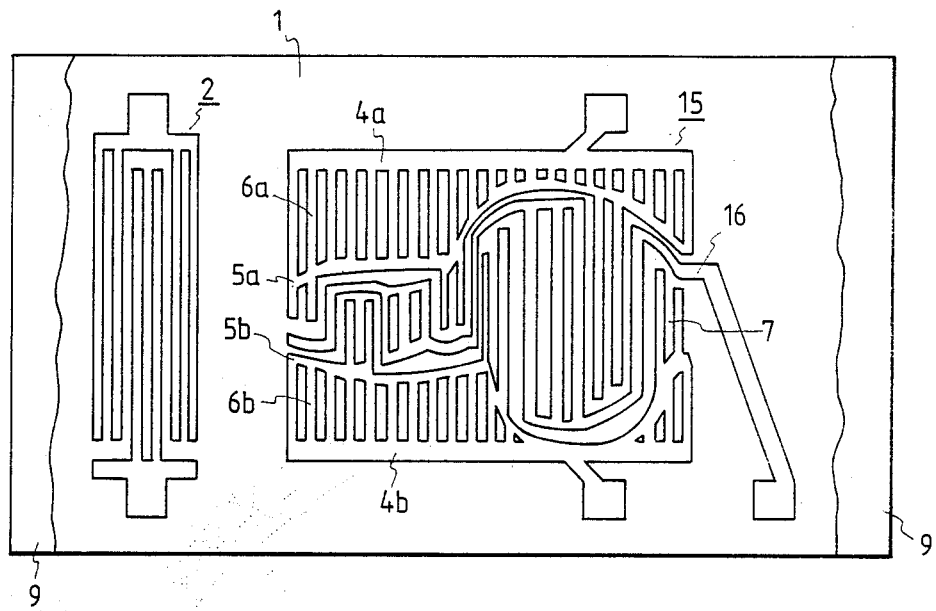
FIG. 12 is a schematic view of a fourth embodiment of a surface acoustic wave device according to the present invention.

FIG. 12 is a schematic view of a fourth embodiment of a surface acoustic wave device according to the present invention. In this embodiment, a unidirectional transducer 15 is used as an output interdigital transducer, thereby further reducing loss. The unidirectional transducer is a group type unidirectional transducer using a meander electrode 16. The second bus-bar electrodes 5a and 5b are also provided in order to suppress the MEL. According to this embodiment, the MEL is suppressed even in the case of using irregular pitch type unidirectional electrodes which are likely to produce MEL.

Figure 13:
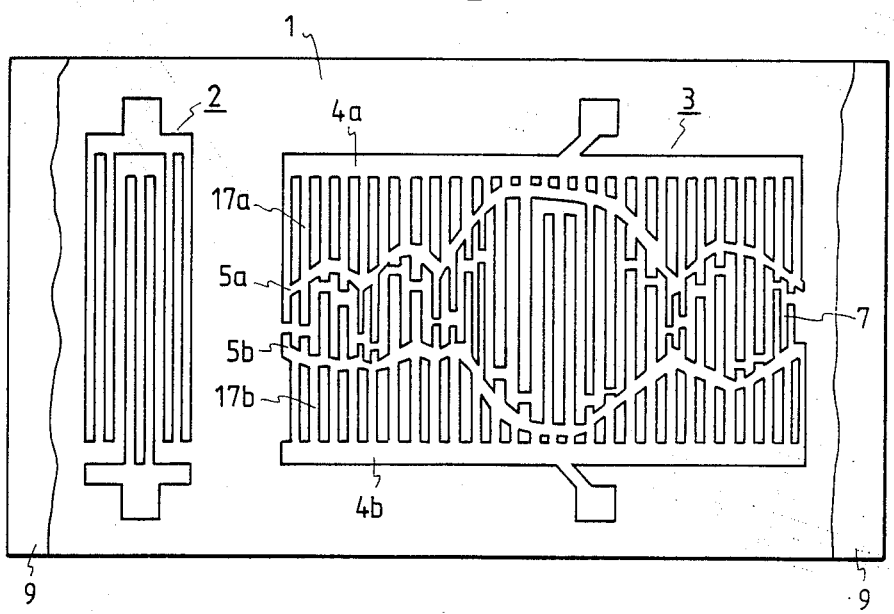
FIG. 13 is a partially enlarged view of a fifth embodiment of a surface-acoustic wave device according to the present invention.

FIG. 13 shows a fifth embodiment of the present invention. This embodiment has the same structure as the third embodiment shown in FIG. 10 except that the respective opposing pairs of electrodes 17a between the first bus-bar electrode 4a and the second bus-bar electrode 5a and electrodes 17b between the first bus-bar electrode 4b and the second bus-bar electrode 5b are not disposed at the right opposite to each other like the opposing pairs of electrodes 6a and 6b in the third embodiment shown in FIG. 10 but disposed at a distance of $\lambda_0/8$ from the respective points of symmetry. More specifically, each of the electrodes 17a and 17b has a width of $\lambda_0/8$ and both of them are arranged at an interval of $\lambda_0/8$. Therefore, the opposite position of the electrode 17a constitutes a gap between the electrodes 17b, while at the opposite position of the gap between the electrodes 17a, the electrode 17b is disposed. In this embodiment, the reflection produced by the electrodes 17a and the reflection produced by the electrodes 17b have opposite phases, so that they cancel each other. As a result, the reflection produced by the electrodes 17a and 17b become almost zero in total, thereby suppressing the MEL more than any other embodiment. Although in the fifth embodiment shown in FIG. 13, the third embodiment shown in FIG. 10 is adopted and the electrodes 17a and 17b are used in place of the electrodes 6a and 6b, it goes without saying that the electrodes 6a and 6b may also be replaced by the electrodes 17a and 17b in the embodiments shown in FIG. 1, 8 and 12. Each of the electrodes 17a and 17b has a width of $\lambda_0/8$ and the intervals of the respective electrodes 17a and 17b are $\lambda_0/8$ in the fifth embodiment, but the width of each of the electrodes 17a and 17b and the intervals of the respective electrodes 17a and 17b may be set at disposal (e.g., the width of the electrode may be set at $\lambda_0/4$ and the interval of the electrodes at $\lambda_0/4$). In this case, it is essential that the opposite position of the electrode 17a constitutes a gap between the electrodes 17b, while at the opposite position of the gap between the electrodes 17a, the electrode 17b is disposed (for example, if the width of the electrode is set at $\lambda_0/4$ and the interval of the electrodes at $\lambda_0/4$, the electrodes 17a and 17b are disposed at a distance of $\lambda_0/4$ from the respective points of symmetry).

Figure 14:
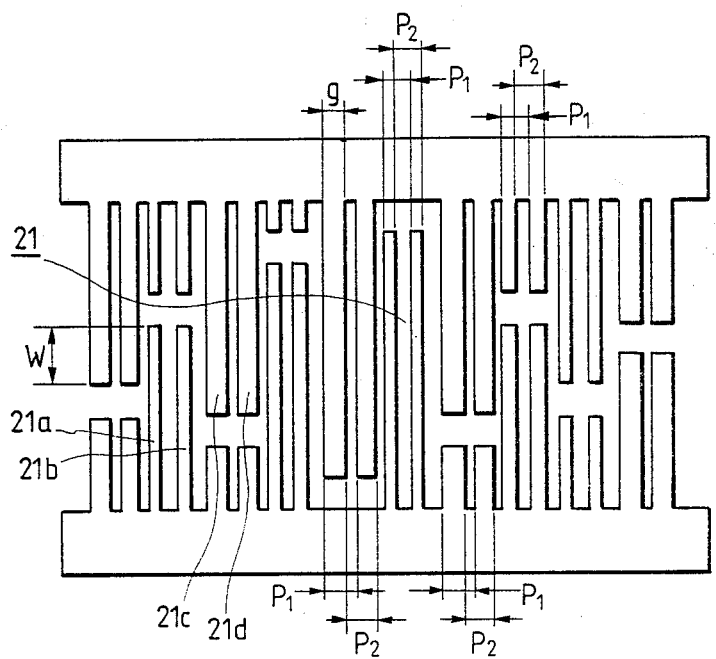
FIG. 14 is a schematic plan view of the apodized transducer of a sixth embodiment of a surface acoustic wave device according to the present invention.

FIG. 14 is a schematic plan view of the interdigital transducer of a sixth embodiment of the present invention. An interdigital electrode 21 is an apodized transducer in which the overlapping width W of the electrodes is not constant, and is used as an output electrode. The input transducer (not shown) is a non-apodized and a split connect type interdigital transducer having a constant aperture W of 1,500 μm. The width of each of the electrodes of the input transducer is $\lambda_0/8$ and the interval between the electrodes is $\lambda_0/8$ ($\lambda_0$ is a wavelength of surface acoustic waves at the center frequency $f_0$). The center frequency of the input transducer is 56.5 MHz and 15 pairs of sources of surface acoustic wave are provided.

In the apodized transducer 21 of this embodiment, the intercentral distance $p_1$ and $p_2$ between the adjacent electrodes is constantly 17 μm, and the ratio of the width g of the electrode to the distance between the adjacent electrodes (metalized ratio $g/p_1$, or $g/p_2$) is not constant. In other words, the width of the electrode is different in the electrode pairs. The metalized ratio g/p varies in the range of 0.1 to 0.4 or 0.6 to 0.9. 50 pairs of sources of surface acoustic wave are provided. Each of the adjacent electrodes of the interdigital transducer 21 forms a pair, and each pair has the same structure. For example the electrodes 21a and 21b have the same structure and the electrodes 21c and 21d have the same structure.

Each of these input and output transducers is composed of an aluminum thin film of 6,000 Å thick deposited on 128° Y-X lithium niobate substrate (not shown) and is formed by photolithography.

This embodiment is used for the IF filter of the intermediate frequency amplifier a color television receiver. The IF filter is inserted between the tuner and the picture and sound amplifier, and has a function of adjusting the picture carrier signal, chroma sub-carrier signal and sound carrier signal on the necessary channel from among the signals selected from the receiving signal by the tuner to an appropriate relative level while suppressing the signals on the other unnecessary channels, and transmitting the thus-adjusted signals to the picture and sound amplifier.

Generally, the level of the sound sub-carrier signal is lowered by 10 to 20 dB more than the level of the picture carrier signal in order to reduce the relative modulation of the picture signal and the sound signal at the intermediate frequency amplifier, thereby obtaining the appropriate sound sensitivity. The frequency characteristic of amplitude of a surface acoustic wave device generally used is non-symmetrical with due regard to the frequency characteristic of a trap provided in order to suppress the picture and sound carrier signals on the adjacent channels.

A surface acoustic wave device is composed of at least two transducers, and a non-apodized transducer (not shown) is used as one (input transducer) of the transducers as in this embodiment, thereby facilitating design and reducing the chip size. Since the amplitude is symmetrical in the frequency characteristic of a non-apodized transducer, when a filter is required to have a non-symmetrical frequency characteristic as described above, the other transducer must have a non-symmetrical frequency characteristic.

Since the intercentral distance between the adjacent sources of surface acoustic wave of a transducer having a non-symmetrical frequency characteristic is not constant, it is impossible to set the width and the non-metalized part constantly at $\lambda_0/8$.

In this embodiment, the intercentral distance between the adjacent electrodes is set in correspondence with the frequency of filtering band, thereby sufficiently suppressing the MEL in the vicinity of the frequency of filtering band.

As described above, the IF filter transmits a picture signal, chroma signal and sound signal. Among these, in the sound signal band, the linearity of the phase characteristic is not very important, and linear phase characteristics are rather required in the picture signal band and the chroma signal band. In view of this fact, this embodiment has a structure for sufficiently suppressing the MEL in the band from the low frequency side (54.57 MHz) of the chroma sub-carrier band to the high frequency side (59.25 MHz) of the picture carrier band.

In the sixth embodiment shown in FIG. 14, since the intercentral distance between the adjacent sources of surface acoustic wave is not constant, the metalized ratio g/p does not become constant. The MEL of the surface acoustic wave having a wave length which is equivalent to 4 times of the intercentral distance p between the adjacent electrodes is cancelled between a pair of electrodes (e.g., a pair of electrodes 21a and 21b, or 21c and 21d). In addition, sufficient MEL suppression is also obtained in the vicinity of that frequency.

Figure 15:
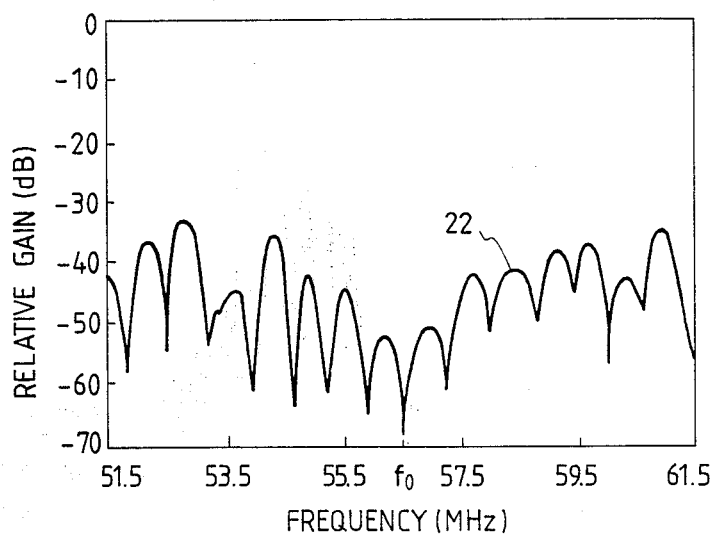
FIG. 15 shows the MEL frequency characteristic of the sixth embodiment shown in FIG. 14.

As shown in FIG. 15, the embodiment shown in FIG. 14 has a sufficient MEL suppressing effect such as not less than 41 dB (based on the main signal) in the frequency band of the chroma sub-carrier band to the picture carrier band. At minimum, the MEL suppression is 35 dB.

Figure 16:
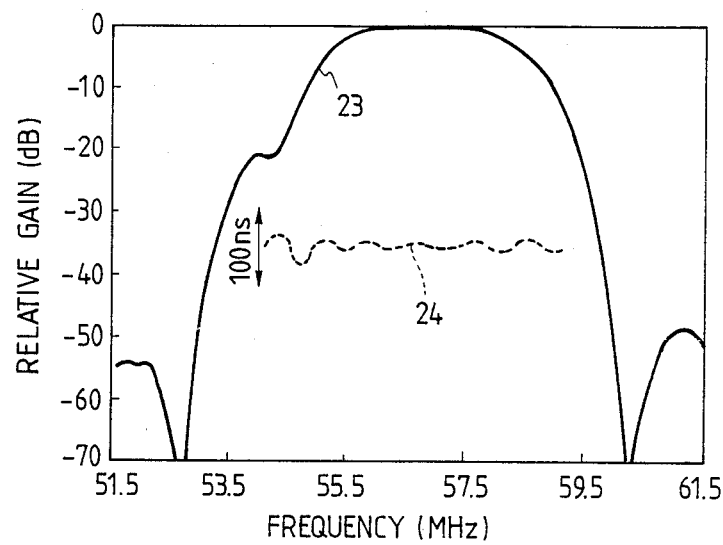
FIG. 16 shows the frequency characteristic of amplitude of the sixth embodiment shown in FIG. 14.

The frequency characteristics of the embodiment of a sound acoustic wave device shown in FIG. 14 are shown in FIG. 16. The ripple on the amplitude - frequency characteristic 23 is not more than 0.2 $dB_{p-p}$ and the ripple on the group delay - frequency characteristic 24 is not more than 60 $ns_{p-p}$. Thus, this embodiment produces good frequency characteristics. The insertion loss in this embodiment is 18.2 dB.

In this embodiment, the intercentral distance between the adjacent same potential electrodes is constant, but it is clear that the distance between the adjacent different potential electrodes may be constant.

Figure 17:
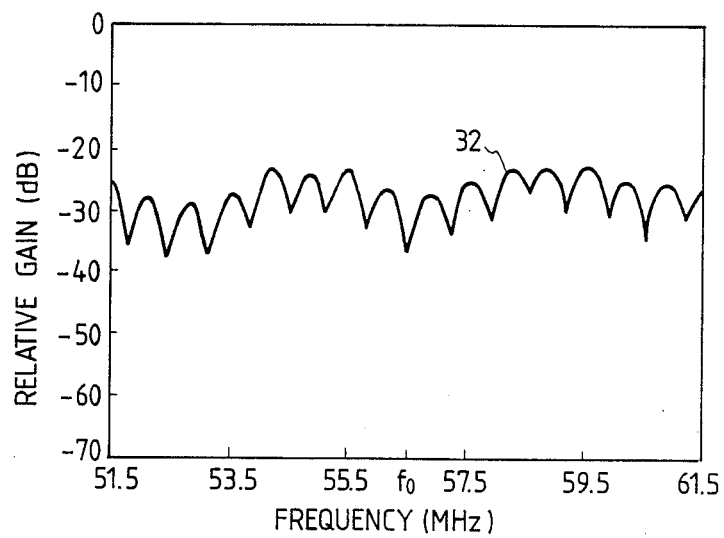
FIG. 17 shows the MEL frequency characteristic of a conventional device.
Figure 18:
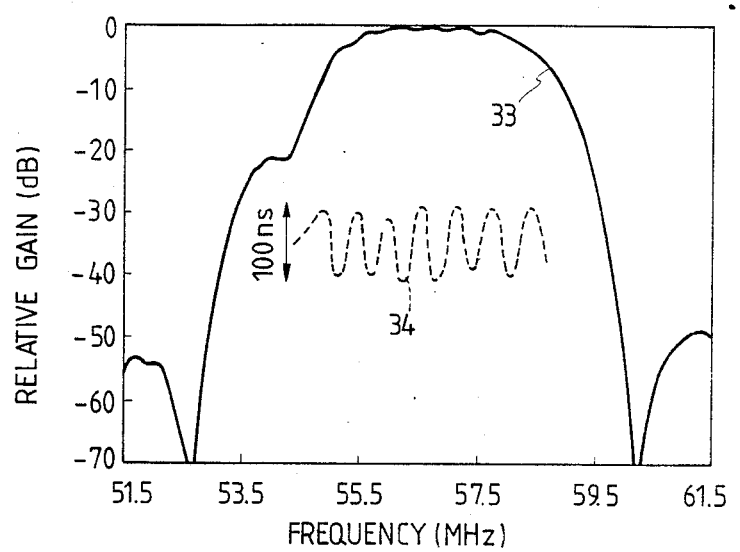
FIG. 18 shows the frequency characteristic of amplitude of a conventional device.
Figure 23:
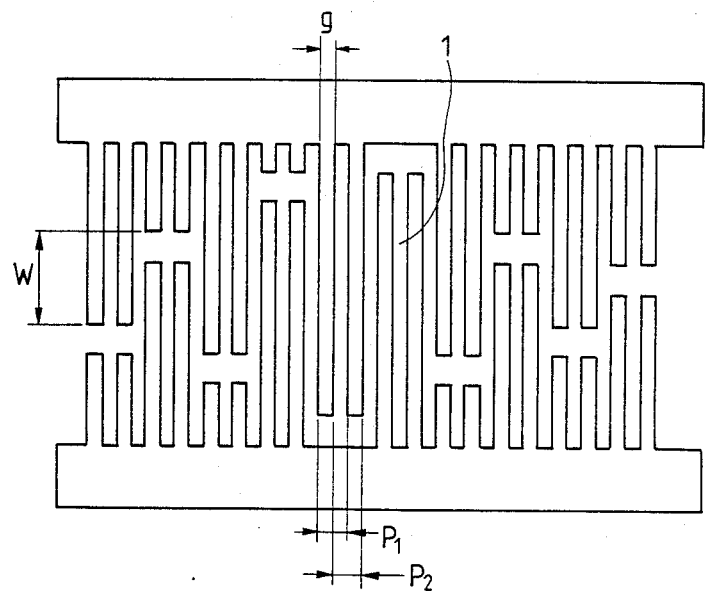
FIG. 23 is a schematic plan view of the apodized transducer of a conventional device.

The improvements effected by the present invention will now be explained with reference to FIGS. 17, 18 and 23 which show the prior art.

The conventional apodized transducer having a non-symmetrical frequency characteristic is designed as follows The width of an electrode and a non-metalized part between the electrodes is ¼ of the interval between the adjacent sources of surface acoustic wave. Therefore, the metalized ratio is constantly 0.5. FIG. 17 shows the MEL frequency characteristic 32 of the transducer having a constant metalized ratio of 0.5. The surface acoustic wave device shown in FIG. 23 has the same structure as the sixth embodiment shown in FIG. 14 except for having a constant metalized ratio of 0.5. In FIG. 17 the loss of MEL in the frequency band is not more than 22 dB. It is clear from the comparison between FIGS. 15 and 17 that the sixth embodiment shown in FIG. 14 has an improving effect by 13 dB. FIG. 18 shows the frequency characteristics of the surface acoustic wave device using the conventional transducer having a constant metalized ratio of 0.5. The surface acoustic wave device has the same structure as the sixth embodiment shown in FIG. 14 except for having a constant metalized ratio of 0.5. The ripple on the amplitude - frequency characteristic 33 is 0.5 $dB_{p-p}$ and the ripple on the group delay - frequency characteristic 34 is as large as 100 $ns_{p-p}$. Thus, such a surface acoustic wave device is difficult to put to practical use.

In contrast, the sixth embodiment of the present invention shown in FIG. 14 is capable of sufficiently suppressing MEL, and therefore it can be put to practical use.

Figure 19:
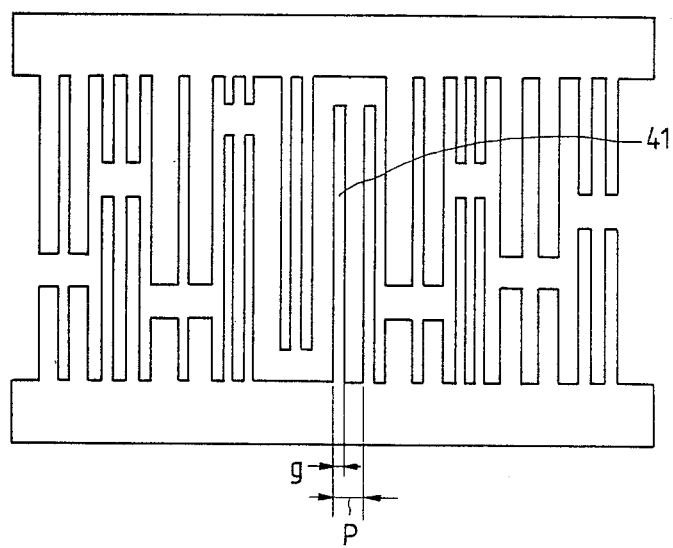
FIG. 19 is a schematic plan view of the apodized transducer of a seventh embodiment of a surface acoustic wave device according to the present invention.
Figure 20:
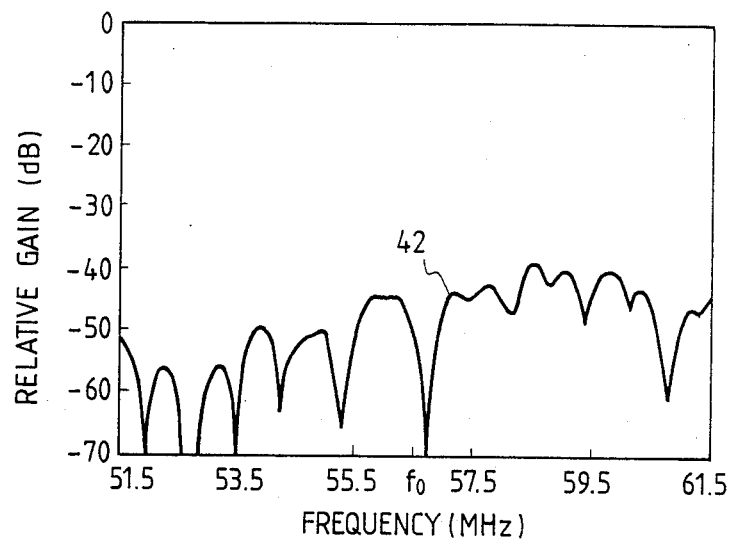
FIG. 20 shows the MEL frequency characteristic of the seventh embodiment shown in FIG. 19.

A seventh embodiment of the present invention will now be explained with reference to FIGS. 19 and 20. FIG. 19 is a schematic plan view of the apodized transducer of this embodiment and FIG. 20 shows the MEL - frequency characteristic 42 of this embodiment.

This embodiment is aimed at suppressing MEL in a broad band. The intercentral distance p between the adjacent electrodes 41 of this embodiment is not constant. In other words, the intercentral distance p between the adjacent electrodes 41 and the metalized ratio g/p are determined such that MEL is suppressed not in a specific frequency band but over the entire band. According to this embodiment shown in FIG. 19, the MEL is suppressed by not less than 39 dB in the entire band, as shown in FIG. 20.

Figure 21:
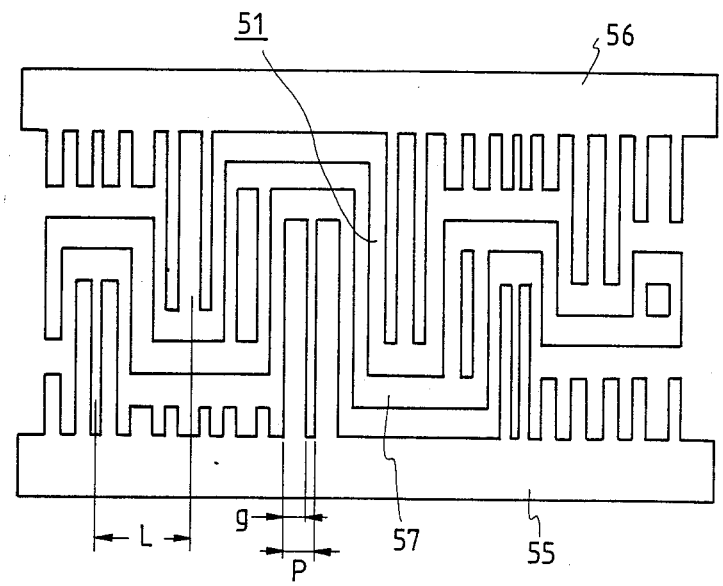
FIG. 21 is a schematic plan view of the apodized transducer of an eighth embodiment of a surface acoustic wave device according to the present invention.
Figure 22:
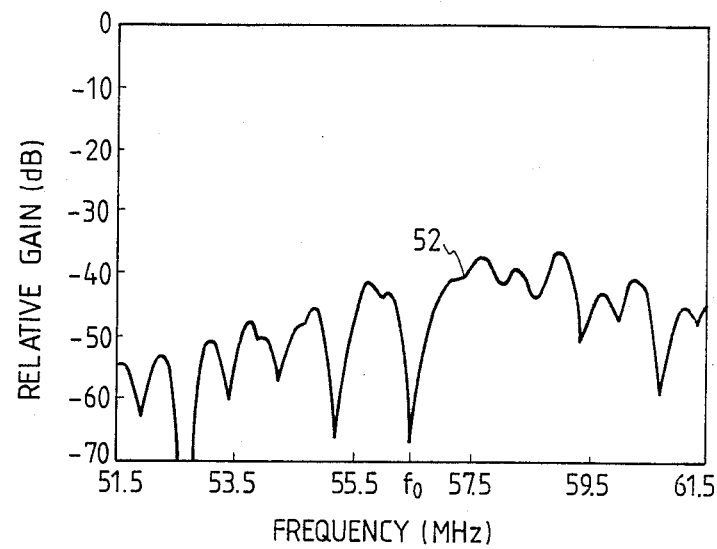
FIG. 22 shows the MEL frequency characteristic of the eighth embodiment shown in FIG. 21.

An eighth embodiment of the present invention will be explained with reference to FIGS. 21 and 22.

In this embodiment, a group type unidirectional transducer is used as an interdigital transducer. FIG. 21 is a schematic plan view of the apodized transducer 51 of this embodiment and FIG. 22 shows the MEL - frequency characteristic 52 of this embodiment.

When a group type unidirectional transducer is applied to a non-apodized transducer (not shown), the amplitude on the high frequency side generally has large asymmetry. It is therefore necessary that an apodized transducer used as the other transducer has larger asymmetry than in the sixth embodiment.

The group type unidirectional transducer 51 is composed of a feeding electrode 55, a reflecting electrode 56 and a meander electrode 57. The group type unidirectional transducer 51 propagates surface acoustic waves unidirectionally, when the geometrical phase difference which is determined by the intercentral distance L between the feeding electrode 55 and the reflecting electrode 56 and the electrical phase difference which is produced on a phase shifter (not shown) connected to the feeding electrode 55 and the reflecting electrode 56 are appropriately set. In this case, if the device is matched, the loss becomes minimum and the undesired reflection (RW) which is determined by the conditions for matching the device with the load is suppressed.

In this embodiment, two pairs of sources of surface acoustic wave are provided for each group. In FIG. 21, only three groups are shown as a part of the transducer. For the suppression of the MEL, the metalized ratio is different in electrodes. In the eighth embodiment shown in FIG. 21, the MEL suppression is not more than 36 dB, as is obvious from FIG. 22. The total loss of the surface acoustic wave device is 6.3 dB, the amplitude ripple is not more than 0.1 $dB_{p-p}$ and the group delay ripple is not more than 40 $ns_{p-p}$. Thus, the eighth embodiment also has good characteristics.

As described above, according to the present invention, even a surface acoustic wave device having a non-symmetrical frequency characteristic is capable of sufficiently suppressing MEL and realizing a frequency characteristic of a low ripple. Since even in the case of using an interdigital transducer having a non-symmetrical frequency characteristic, MEL is sufficiently suppressed, the ripple on the frequency characteristic is suppressed and the capacity of the filter is enhanced.

Although the present invention is applied to an overlapping apodized transducer in the above embodiments, it goes without saying that the present invention is also applicable to what is called phase apodized transducer, in which the overlapping width is constant and the intercentral distance between the adjacent sources of surface acoustic wave is not constant.

While there has been described what are at present considered to be preferred embodiments of the invention, it will be understood that various modifications may be made thereto, and it is intended that the appended claims cover all such modifications as fall within the true spirit and scope of the invention.

What is claimed is:
1. A surface acoustic wave device comprising:
a piezoelectric substrate;
an input transducer comprised of interdigital electrodes and formed on said substrate; and
an output interdigital transducer comprised of interdigital electrodes and formed on said substrate;

at least one of said input transducer and said output transducer being comprised of:

first bus-bar electrodes which connect the edges of the same potential electrodes of said interdigital electrodes in alignment;

second bus-bar electrodes which connect the same potential electrodes of said interdigital electrodes in the vicinity of the overlapping portions;

a first electrode group comprised of a plurality of electrodes having the same width disposed between said first bus-bar electrodes and said second bus-bar electrodes at a regular pitch having an interval equal to the width of said electrodes; and a second electrode group comprised of electrodes arranged at irregular pitches with one end thereof connected to one of said second bus-bar electrodes, and the other ends of at least a part of said electrodes being overlapped with the different potential electrodes, thereby constituting sources of a surface acoustic wave.

2. A surface acoustic wave device according to claim 1, wherein each of said second bus-bar electrodes is formed into a configuration of cosine.

3. A surface acoustic wave device according to claim 1, wherein said second bus-bar electrodes are formed along the envelopes of the overlapping portions of said electrodes of said second electrode group.

4. A surface acoustic wave device according to claim 1, wherein said first electrode group is comprised of plural pairs of said different potential electrodes which are disposed at a distance equivalent to the width of said electrode from the respective points of symmetry.

5. A surface acoustic wave device according to claim 1, wherein said input transducer or said output transducer which is comprised of said first bus-bar electrodes, said second bus-bar electrodes, said first electrode group and said second electrode group further incorporates a meander electrode which is disposed in such a manner as to meander through said second electrode group and constitutes in combination a group type unidirectional transducer.

6. A surface acoustic wave device comprising:

a piezoelectric substrate;

an input transducer comprised of interdigital electrodes and formed on said substrate; and an output interdigital transducer comprised of interdigital electrodes and formed on said substrate;

at least one of said input transducer and said output transducer being comprised of:

bus-bar electrodes which connect the edges of the same potential electrodes of said interdigital electrodes in alignment;

an irregular pitch electrode group comprised of electrodes arranged at irregular pitches with one end thereof connected to one of said bus-bar electrodes, and the other ends of at least a part of said electrodes being overlapped with the different potential electrodes, thereby constituting the sources of a surface acoustic wave, each of adjacent electrodes which have the same width and the same length forming a pair, the metalized ratio g/p, which is which is the ratio of the width g of said electrode and the intercentral distance p between the adjacent electrodes, being varied in the range of $0.1 \leq g/p \leq 0.4$ or $0.6 \leq g/p < 0.9$ depending upon said pair, thereby suppressing the undesired reflection produced at the boundary of said electrode.

7. A surface acoustic wave device according to claim 6, wherein the intercentral distance between adjacent electrodes which constitute said irregular pitch electrode group is constant and the width of said electrode varies depending upon said pair, thereby varying the metalized ratio g/p in the range of $0.1 \leq g/p \leq 0.4$ or $0.6 \leq g/p \leq 0.9$ depending upon said pair.

8. A surface acoustic wave device according to claim 6, wherein said input transducer or said output transducer which is comprised of said bus-bar electrodes and said irregular pitch electrode group further incorporates a meander electrode which is disposed in such a manner as to meander through said irregular pitch electrode group and constitutes in combination a group type unidirectional transducer.

* * * * *